(12) United States Patent  
Ahn

(10) Patent No.: US 8,582,371 B2
(45) Date of Patent: Nov. 12, 2013

(54) SEMICONDUCTOR MEMORY DEVICE AND METHOD OF OPERATING THE SAME

(75) Inventor: Sung Hoon Ahn, Seoul (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 12 days.

(21) Appl. No.: 13/333,288

(22) Filed: Dec. 21, 2011

(65) Prior Publication Data

US 2012/0170379 A1    Jul. 5, 2012

(30) Foreign Application Priority Data

Dec. 30, 2010    (KR) .................. 10-2010-0139171

(51) Int. Cl.
G11C 11/34    (2006.01)

(52) U.S. Cl.
USPC ............................. 365/185.24; 365/185.25

(58) Field of Classification Search
USPC ...................................... 365/185.24, 185.25
See application file for complete search history.

(56) References Cited

U.S. PATENT DOCUMENTS

2009/0016111 A1*    1/2009   Kim et al. ............... 365/185.17
2010/0046290 A1*    2/2010   Park et al. ............... 365/185.2

FOREIGN PATENT DOCUMENTS

KR    1020110001579    1/2011

OTHER PUBLICATIONS

Notice of Allowance issued from the Korean Intellectual Property Office on Apr. 27, 2012.

* cited by examiner

Primary Examiner — Michael Tran
(74) Attorney, Agent, or Firm — IP & T Group LLP

(57) ABSTRACT

A semiconductor memory device according to an aspect of the present disclosure includes a first page buffer coupled to a first even bit line and a first odd bit line, a second page buffer coupled to a second even bit line and a second odd bit line, and a controller configured to control the first and the second page buffers so that the second page buffer sets the second even bit line in a floating state such that the voltage of the second even bit line is changed according to a shift in the voltage of the first odd bit line, when a read operation for memory cells coupled to the first odd bit line is performed, and the second page buffer stores data corresponding to the level of threshold voltages of the memory cells by detecting a shift in the voltage of the second even bit line.

22 Claims, 6 Drawing Sheets

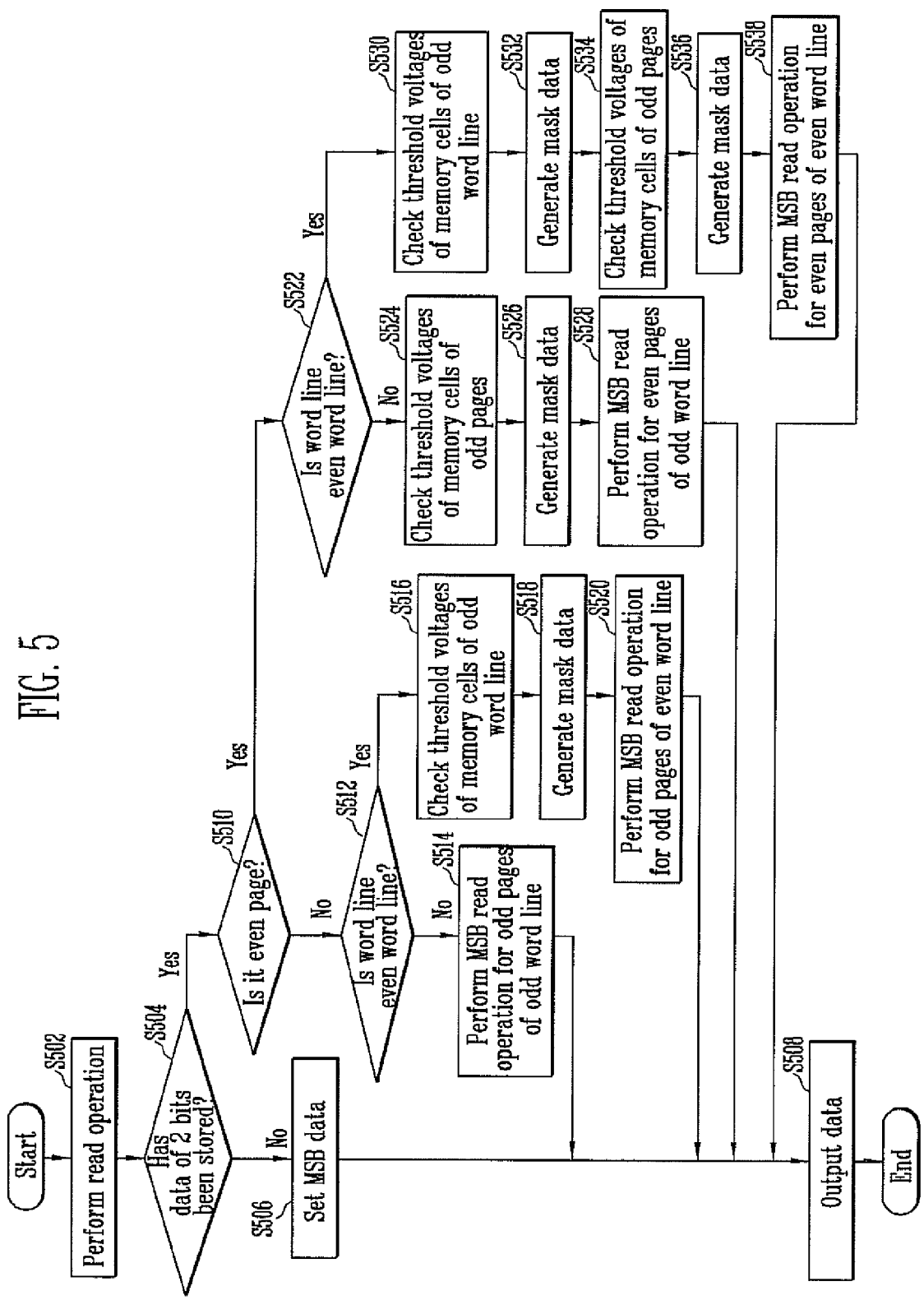

SEMICONDUCTOR MEMORY DEVICE AND METHOD OF OPERATING THE SAME

CROSS-REFERENCE TO RELATED APPLICATION

Priority to Korean patent application number 10-2010-0139171 filed on Dec. 30, 2010, the entire disclosure of which is incorporated by reference herein, is claimed.

BACKGROUND

Exemplary embodiments relate to a semiconductor memory device and a method of operating the same and, more particularly, to a nonvolatile memory device and a method of operating the same.

A NAND flash memory device is a representative nonvolatile memory device. The memory cell array of the NAND flash memory device includes a plurality of memory blocks. Each of the memory blocks includes a plurality of memory strings coupled between bit lines and a common source line. Each of the memory strings includes a drain select transistor, memory cells, and a source select transistor coupled in series between each bit line and the common source line. The gates of the drain select transistors are coupled to a drain select line, the control gates of the memory cells are coupled to respective word lines, and the gates of the source select transistors are coupled to a source select line.

In order to store data in the memory cells, a program operation is performed. The program operation is performed on memory cells from memory cells, coupled to a word line adjacent to the source select line within one memory block, to memory cells coupled to a word line adjacent to the drain select line. Furthermore, the program operation for even pages, including even-numbered ones of memory cells coupled to a selected word line, is first performed, and a program operation for odd pages, including odd-numbered ones of the memory cells coupled to the selected word line is then performed.

With the degree of integration increasing, the interval between memory cells is narrowed. Accordingly, a program interference phenomenon is generated in memory cells, coupled to a word line adjacent to a selected word line or included in a page adjacent to a selected page, during a program operation. Consequently, the threshold voltages of the memory cells are shifted.

Since the even page program operation is performed earlier than the odd page program operation, the threshold voltages of memory cells included in the even pages are relatively greatly shifted owing to the program interference phenomenon. Accordingly, a threshold voltage distribution of the memory cells may be widened, and an error may occur in an operation of reading data.

BRIEF SUMMARY

According to exemplary embodiments, in a read operation for an even page, a shift of the threshold voltages of even memory cells due to a program interference phenomenon is predicted by detecting the threshold voltages of the even memory cells and odd memory cells on both sides of each of the even memory cells. A read operation condition for the even memory cells is controlled according to the result of the prediction. Accordingly, reliability of output data can be improved.

A semiconductor memory device according to an aspect of the present disclosure includes a first page buffer coupled to a first even bit line and a first odd bit line, a second page buffer coupled to a second even bit line and a second odd bit line, and a controller configured to control the first and the second page buffers so that the second page buffer sets the second even bit line in a floating state such that the voltage of the second even bit line is changed according to a shift in the voltage of the first odd bit line, when a read operation for memory cells coupled to the first odd bit line is performed, and the second page buffer stores data corresponding to the level of threshold voltages of the memory cells by detecting a shift in the voltage of the second even bit line.

The controller controls the first and the second page buffers so that a ground voltage or a power supply voltage is supplied to the first even bit line and the second odd bit line during the read operation.

The controller controls the first page buffer so that the data corresponding to the level of threshold voltages of the memory cells is stored in the first page buffer.

A semiconductor memory device according to another aspect of the present disclosure includes a memory cell array configured to comprise even strings coupled to even bit lines and odd strings coupled to odd bit lines, a voltage supply circuit configured to supply voltages for a program operation and a read operation of even memory cells included in the even strings and odd memory cells included in the odd strings, page buffers each coupled to a pair of the even bit line and the odd bit line, and a controller configured to control the page buffers so that each of the page buffers detects the level of threshold voltages of the odd memory cells by detecting the voltages of the even bit line and the odd bit lines placed on both sides of each of the even bit lines and to control the voltage supply circuit in order to control a read operation condition for the even memory cells each placed between the odd memory cells according to results of the detection.

A method of operating a semiconductor memory device according to yet another aspect of the present disclosure includes precharging a first odd bit line, coupled to a first page buffer and adjacent to a second even bit line, in the state in which the second even bit line coupled to a second page buffer is floated, performing a read operation in order to detect the level of threshold voltages of memory cells coupled to the first odd bit line, and detecting a shift in the voltage of the second even bit line due to a capacitance coupling phenomenon according to a shift in the voltage of the first odd bit line resulting from the read operation and storing data, corresponding to the level of threshold voltages of the memory cells, in the second page buffer.

During the read operation, a ground voltage or a power supply voltage is supplied to the first even bit line coupled to the first page buffer and the second odd bit line coupled to the second page buffer.

When the data is stored in the second page buffer, the data is stored in the first page buffer.

A method of operating a semiconductor memory device according to further yet another aspect of the present disclosure includes allowing each of page buffers, coupled to a pair of bit lines including an even bit line and an odd bit line, to detect a level of threshold voltages of odd memory cells placed on both sides of each of even memory cells by detecting voltages of odd bit lines placed on both sides of the even bit line, generating mask data based on the detected level, and performing a read operation for supplying read voltages, set based on the mask data, to the even memory cells in order to output data stored in the even memory cells.

A method of operating a semiconductor memory device according to further yet another aspect of the present disclosure includes generating first mask data for determining whether a program interference phenomenon has occurred in memory cells coupled to a selected word line by sensing the level of threshold voltages of memory cells coupled to a word line adjacent to the selected word line, allowing each of page buffers, each coupled to a pair of bit lines including an even bit line and an odd bit line, to detect the level of threshold voltages of odd memory cells placed on both sides of each of even memory cells coupled to the selected word line by detecting the voltages of the even bit line and the odd bit lines placed on both sides of the even bit line, generating second mask data corresponding to the detected level of threshold voltages of the odd memory cells, and performing a read operation for supplying, to the even memory cells, read voltages set based on the first and the second mask data in order to output data stored in the even memory cells.

BRIEF DESCRIPTION OF THE DRAWINGS

FIG. 5 is a flowchart illustrating a method of operating the semiconductor memory device according to another exemplary embodiment of this disclosure.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the exemplary embodiments of the disclosure.

Figure 1:
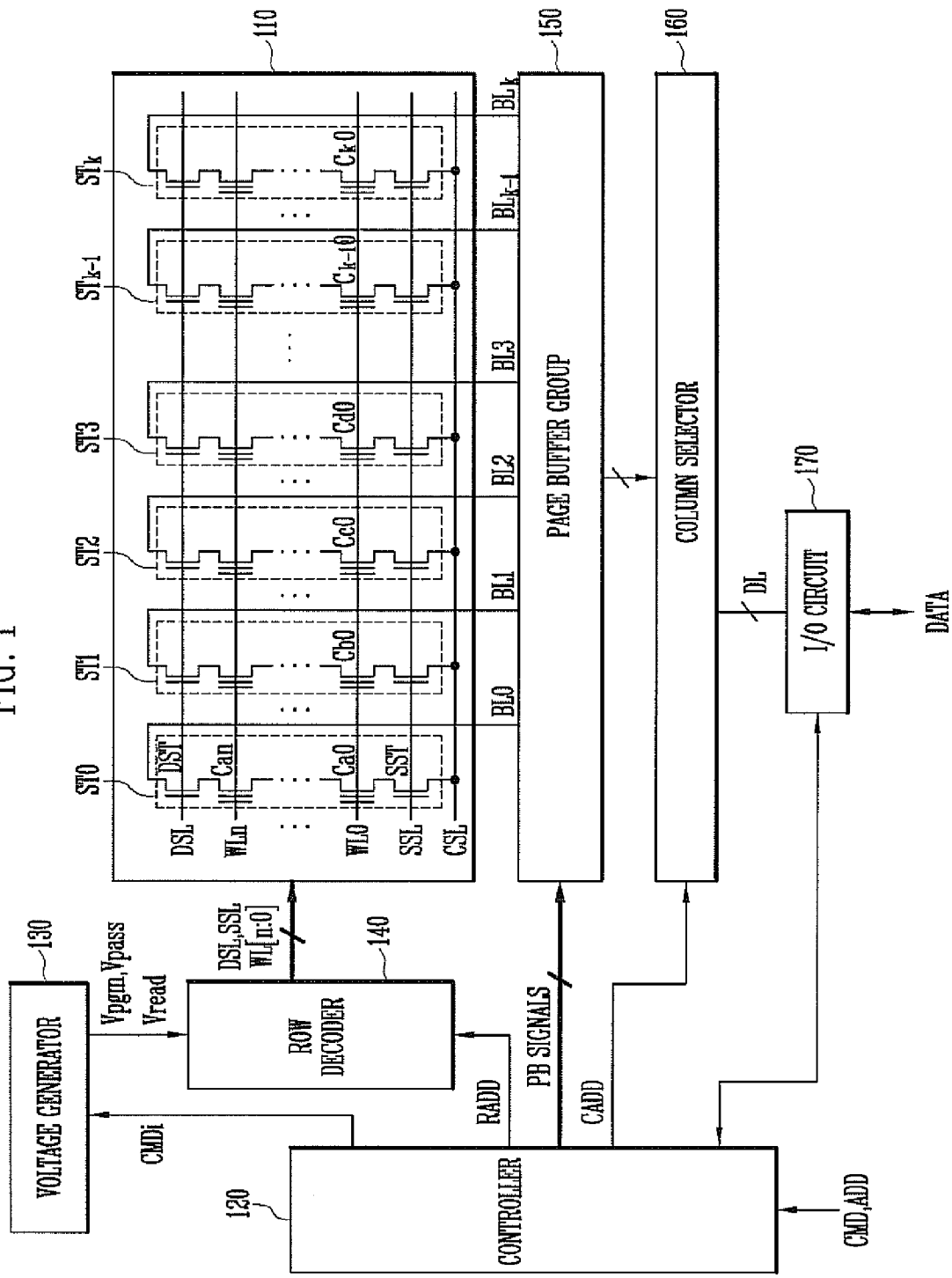
FIG. 1 is a circuit diagram of a semiconductor memory device according to an exemplary embodiment of this disclosure.

FIG. 1 is a circuit diagram of a semiconductor memory device according to an exemplary embodiment of this disclosure.

Referring to FIG. 1, the semiconductor memory device according to the exemplary embodiment of this disclosure includes a memory cell array 110, an operation circuit group (130, 140, 150, 160, 170) for performing a program operation or a read operation for the memory cells of the memory cell array 110, and a controller 120 for controlling the operation circuit group (130, 140, 150, 160, 170) so that the program operation or the read operation of the memory cells is performed.

In a NAND flash memory device, the operation circuit group includes a voltage supply circuit (130, 140), a page buffer group 150, a column selector 160, and an input/output (I/O) circuit 170.

The memory cell array 110 includes a plurality of memory blocks. FIG. 1 shows only one of the memory blocks. The memory block includes a plurality of strings ST0 to STk coupled between bit lines BL0 to BLk and a common source line CSL. Each (for example, ST0) of the strings includes a source select transistors SST having a source coupled to the common source line CSL, a plurality of memory cells Ca0 to Can, and a drain select transistor DST having a drain coupled to the bit line BL0. The gate of the source select transistor SST is coupled to a source select line SSL. The gates of the memory cells Ca0 to Can are coupled to respective word lines WL0 to WLn. The gate of a drain select transistor DST is coupled to a drain select line DSL. The strings ST0 to STk are coupled to the respective bit lines BL0 to BLk and are in common coupled to the common source line CSL.

The memory block includes the memory cells Ca0 to Cd0 to Can to Cdn for storing data and flag cells Ck-10 and Ck0 for storing information about the data storage states of the memory cells. For example, the flag cells may store information about whether data of 1 bit or data of 2 bits is stored in the memory cells.

In the NAND flash memory device, the memory block may be divided into physical pages or logical pages. The physical pages include even pages and odd pages. The logical pages include least significant bit (hereinafter referred to as an 'LSB') pages and most significant bit (hereinafter referred to as an 'MSB') pages. The logical page is applied when data of 2 bits is stored in one memory cell. The distinguishment of the pages is well known in the art, and a detailed description thereof is omitted. The page (or, pair of the even page and the odd page) is a basic unit for a program operation or a read operation.

For example, the memory cells Ca0 to Ck0 coupled to one word line (for example, WL0) form one physical page. Even-numbered memory cells Ca0, Cc0 to Ck-10 coupled to one word line (for example, WL0) may form one even physical page, and odd-numbered memory cells Cb0, Cd0 to Ck0 coupled thereto may form one odd physical page.

Meanwhile, the number of logical pages included a word line is determined according to the number of bits of data stored in a memory cell. For example, when data of 2 bits is stored in a memory cell, one word line includes two logical pages. When data of 3 bits is included in a memory cell, one word line includes three logical pages.

The controller 120 internally generates an internal command signal CMDi for a program operation, a read operation, or an erase operation in response to a command signal CMD and generates control signals PB SIGNALS for controlling the page buffers (not shown) of the page buffer group 150 according to the type of the operation. Furthermore, the controller 120 internally generates a row address signal RADD and a column address signal CADD in response to an address signal ADD.

The voltage supply circuit (130, 140) supplies the drain select line DSL, the word lines WL0 to WLn, and the source select line SSL of the memory block with operating voltages for the program operation, the erase operation, and the read operation of the memory cells in response to the internal command signal CMDi and the row address signal. The voltage supply circuit includes a voltage generator 130 and a row decoder 140.

The voltage generator 130 outputs the operating voltages for programming, reading, or erasing the memory cells to global lines in response to the internal command signal CMDi and outputs operating voltages (for example, Vpgm and Vpass) to the global lines when the memory cells are programmed.

The row decoder 140 transfers the operating voltages of the voltage generator 130 to the strings ST0 to STk of the memory block in response to the row address signal RADD of the controller 120. That is, the operating voltages are supplied to the local lines DSL, WL0 to WLn, and SSL of the memory block.

The page buffer group 150 includes the page buffers coupled to the bit lines BL0 to BLk. For example, each of the page buffers may be coupled to a pair of bit lines, including an even bit line and an odd bit line. The page buffer supplies voltages necessary to store data in the memory cells Ca0 to Ck0 to the bit lines BL1 to BLk in response to the control signals PB SIGNALS. More particularly, the page buffer group 150 precharges the bit lines BL0 to BLk in the program operation, the erase operation, or the read operation of the memory cells Ca0 to Ck0 or latches data, corresponding to threshold voltages of the memory cells Ca0 to Ck0, according to a shift of the voltages of the bit lines BL0 to BLk. That is, the page buffer group 150 controls the voltages of the bit lines BL1 to BLk according to the data stored in the memory cells Ca0 to Ck0 and detects the data stored in the memory cells Ca0 to Ck0.

The column selector 160 selects the page buffers of the page buffer group 150 in response to the column address signal CADD of the controller 120 and outputs data DATA latched in the selected page buffers.

The I/O circuit 170 transfers external data DATA to the column selector 160 under the control of the controller 120 during a program operation so that the data is inputted to the page buffer group 150. When the column selector 160 sequentially transfers the data to the page buffers of the page buffer group 150, the page buffers store the received data in their latches. Furthermore, in a read operation, the I/O circuit 170 externally outputs data DATA received from the page buffers of the page buffer group 150 via the column selector 160.

An operation of the semiconductor memory device constructed as above is described below.

Figure 2:
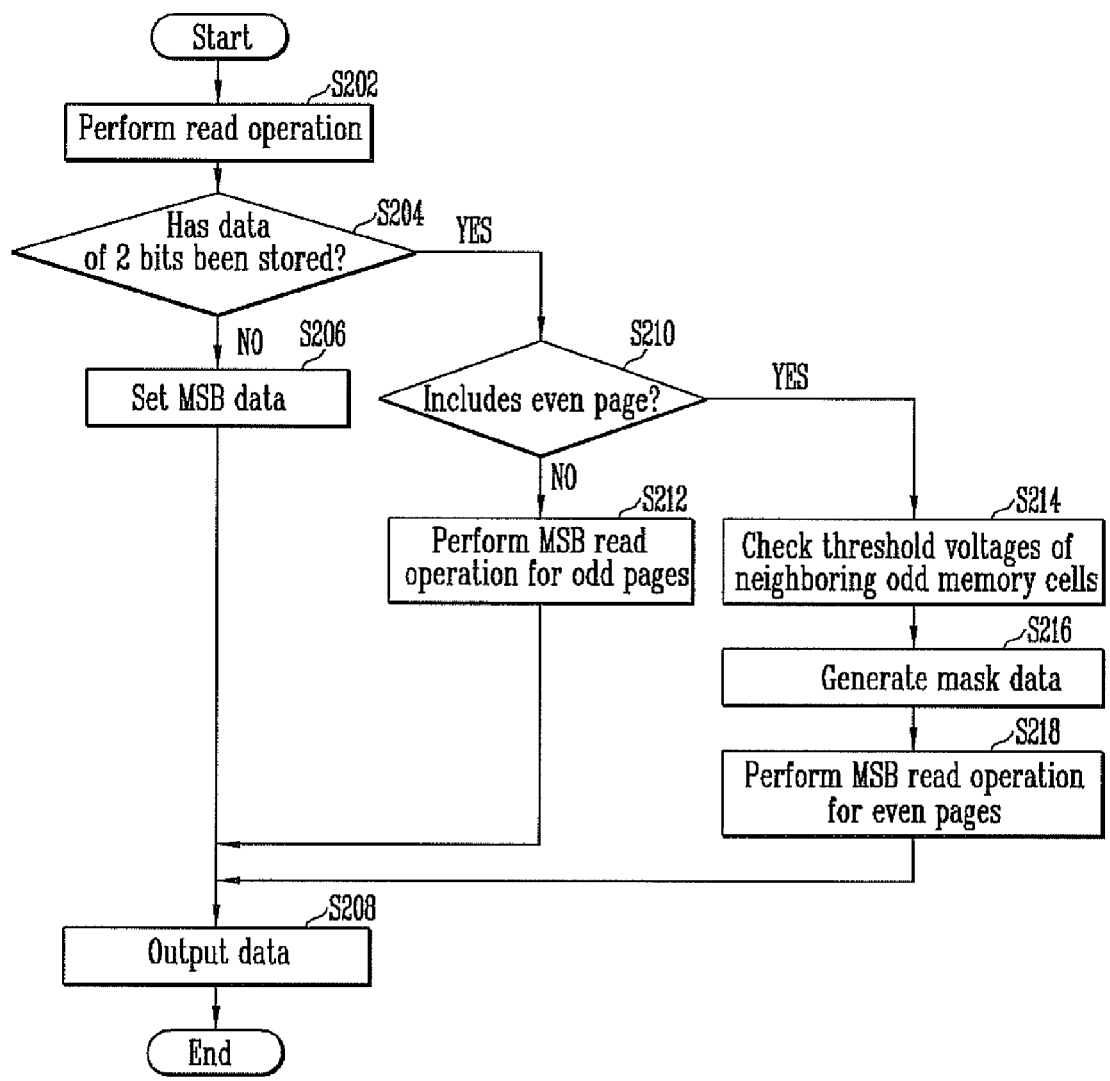
FIG. 2 is a flowchart illustrating a method of operating the semiconductor memory device according to an exemplary embodiment of this disclosure.

FIG. 2 is a flowchart illustrating a method of operating the semiconductor memory device according to an exemplary embodiment of this disclosure.

Referring to FIGS. 1 and 2, at step S202, a read operation for a selected page is performed by supplying a read voltage (for example, a ground voltage) to a selected word line (for example, WL0). If the even pages of the even pages (corresponding to the memory cells Ca0 and Cc0) and the odd pages (corresponding to the memory cells Cb0 and Cd0) included in the selected word line are selected, data stored in the memory cells Ca0 and Cc0 and data stored in the flag cell Ck-10 are latched in the page buffer group 150 through the read operation.

At step S204, the controller 120 checks the data of the flag cell Ck-10 in the data latched in the page buffer group 150 and determines whether data of 2 bits has been stored in each of the memory cells Ca0 and Cc0.

If, as a result of the determination, data of 1 bit (that is, LSB data) not the data of 2 bits is stored in each of the memory cells Ca0 and Cc0, MSB data for the memory cells Ca0 and Cc0 is randomly set in order to match the read operation with a read operation for memory cells which are included in another memory block or coupled to another word line and configured to have data of 2 bits (that is, LSB data and MBS data) stored therein, at step S206. For example, although MSB data is not stored in the memory cells Ca0 and Cc0, MSB data having the same value (for example, '1') may be set to be stored in all the memory cells Ca0 and Cc0. Such setting may be performed within the page buffer group 150 under the control of the controller 120.

At step S208, the MSB data, randomly set and latched in the page buffer group 150, is outputted.

Meanwhile, if, as a result of the determination at step S204, the data of 2 bits (that is, LSB data and MSB data) is determined to be stored in each of the memory cells Ca0 and Cc0 through an LSB program operation and an MSB program operation, it is determined whether the selected page includes even pages at step S210.

If, as a result of the determination, the selected page is determined to include odd pages not the even pages, the MSB read operation for the odd pages is performed at step S212. Accordingly, MSB data stored in the odd pages is latched in the page buffer group 150. In an MSB program operation for storing data in memory cells, the MSB program operation for storing the data in even pages is first performed and the MSB program operation for storing the data in odd pages is then performed. Accordingly, a program interference phenomenon due to the MSB program operation for the even pages is not generated in the memory cells of the odd pages. For this reason, the MSB read operation for the odd pages is normally performed by not taking a program interference phenomenon due to the MSB program operation for the even pages into consideration.

At step S208, the data of the odd pages latched in the page buffer group 150 is outputted.

If, as a result of the determination at step S210, the selected page is determined to be the even page, the MSB read operation for the even pages is performed.

In an operation for storing data, a program operation for storing the data in even pages is first performed, and a program operation for storing the data in odd pages is then performed. At this time, a program interference phenomenon due to the program operation for the odd pages is generated in the memory cells of the even pages. Accordingly, after the program operation for storing MSB data in the even pages is performed, the threshold voltages of memory cells of the even pages are shifted owing to the program interference phenomenon.

In this case, in order to determine a shift of the threshold voltages of memory cells of the even pages, the threshold voltages of memory cells of the even pages and the threshold voltages of memory cells of odd pages on both sides of each of the even pages have to be detected, and an MSB read operation condition for the even pages have to be changed according to the result of the detection. This is described in detail below.

Figure 3A:
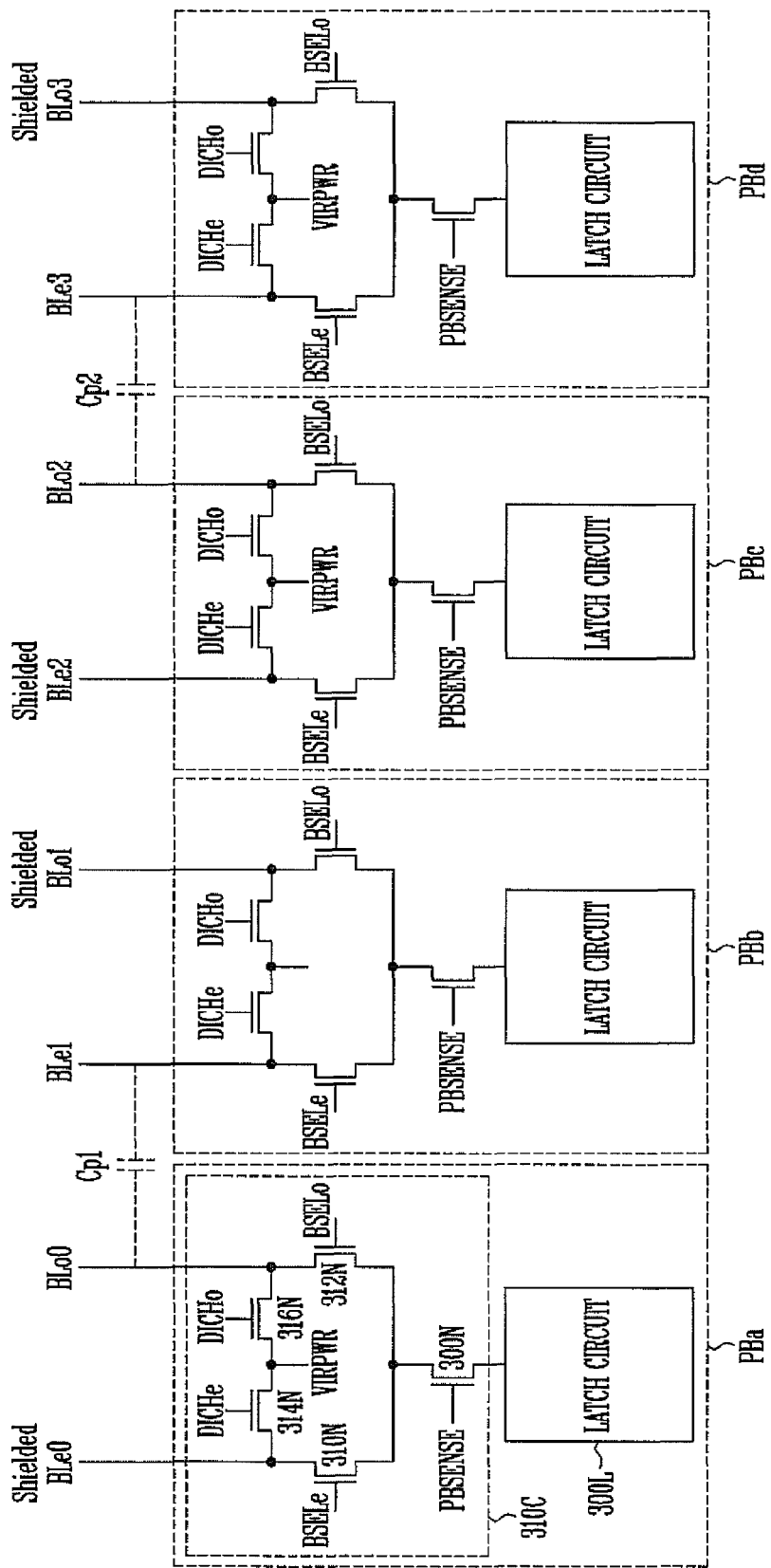
FIGS. 3A and 3B are circuit diagrams illustrating the operations of page buffers shown in FIG. 1.
Figure 3B:
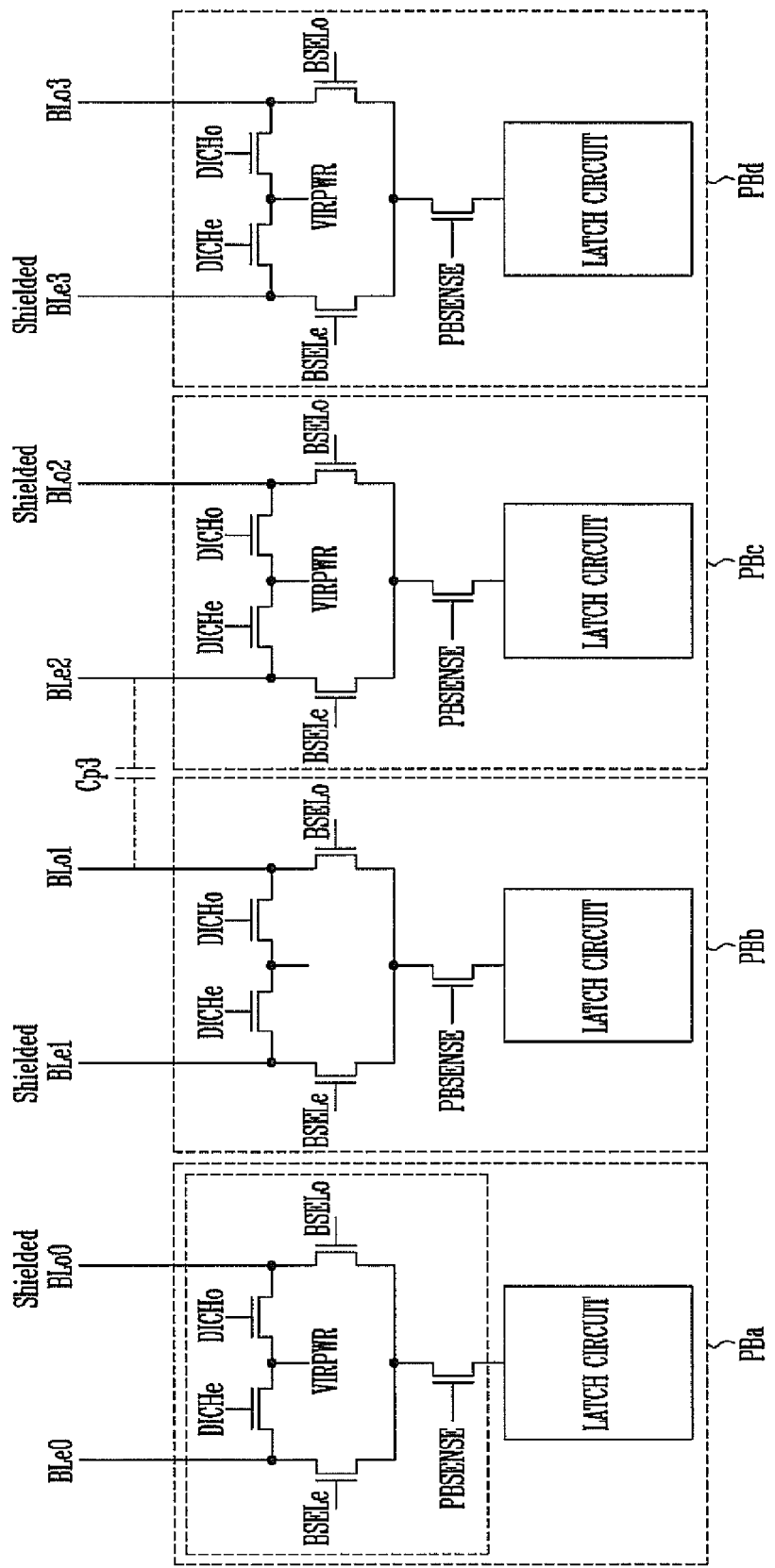
Figure 4:
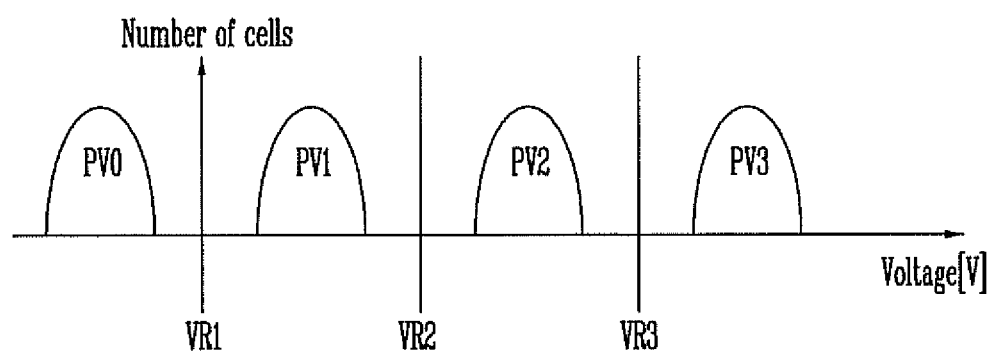
FIG. 4 is a graph illustrating threshold voltage distributions of memory cells in each of which data of 2 bits is stored.

FIGS. 3A and 3B are circuit diagrams illustrating the operations of the page buffers shown in FIG. 1. FIG. 4 is a graph illustrating threshold voltage distributions of memory cells in each of which data of 2 bits is stored.

Referring to FIGS. 2 and 3A, prior to the MSB read operation for the even pages, in order to set the MSB read operation condition for the memory cells of the even pages (hereinafter referred to as 'even memory cells'), the threshold voltages of memory cells adjacent to both sides of each of the even memory cells have to be detected through odd bit lines BLo0 and BLo1. If data of 2 bits is sought to be stored, the threshold voltages of the memory cells have four levels PV0 to PV3 according to data stored therein. Accordingly, in order to check the threshold voltages of the memory cells, a read operation using the three read voltages VR1 to VR3 has to be performed.

Here, the even bit line BLe1 and the odd bit line BLo1 of the odd bit lines BLo0 and BLo1 adjacent to both sides of the even bit line BLe1 are coupled to the same page buffer PBb as the even bit line BLe1. However, the odd bit line BLo0 is coupled to a different page buffer PBa from the even bit line BLe1. Accordingly, the page buffer PBb cannot directly detect the threshold voltages of memory cells of the odd pages (hereinafter referred to as 'odd memory cells') coupled to the odd bit line BLo0. For this reason, the page buffer PBb must receive the values of threshold voltages of the odd memory cells, coupled to the odd bit line BLo0, from a neighboring page buffer PBa. To this end, a data transfer circuit may be disposed between the neighboring page buffer PBa and the page buffer PBb. In this case, however, the degree of integration of devices may be reduced owing to the area occupied by the data transfer circuit.

Accordingly, there is proposed a method of the page buffer PBb detecting the threshold voltages of the odd memory cells through the odd bit line BLo0, coupled to the page buffer PBa, using a capacitance coupling phenomenon.

First, a switching element (for example, 310N) of a bit line control circuit 310C is turned off so that the even bit lines BLe1 and BLe3 coupled to the even-numbered page buffers PBb and PBd become a floating state. The odd bit lines BLo0 and BL02 of the odd-numbered page buffers PBa and PBc are precharged to a precharge voltage generated from a latch circuit 300L via switching elements 310N and 312N. Here, a parasitic capacitor Cp1 is placed between the odd bit line BLo0 and the even bit line BLe1, and the even bit line BLe1 is in the floating state. Accordingly, when the voltage of the odd bit line BLo0 rises owing to a capacitance coupling phenomenon, the voltage of the even bit line BLe1 also rises. At this time, a specific voltage (for example, a ground voltage or a power supply voltage) generated from a virtual voltage source VIRPWR can be supplied to the remaining bit lines BLe0, BLo1, BLe2, and BLo3 through the switching elements 314N or 316N so that the remaining bit lines BLe0, BLo1, BLe2, and BLo3 function to shield the capacitance coupling phenomenon.

Next, a sense operation (or a read operation) for detecting the threshold voltages of the odd memory cells is performed using the read voltages VR1 to VR3. In the sense operation, when the threshold voltages of the odd memory cells are higher than the read voltage supplied to the odd memory cells, the voltage of the odd bit line BLo0 or BLo2 is lowered. The sense operation includes a first sense operation using the first read voltage VR1, a second sense operation using the second read voltage VR2, and a third sense operation using the third read voltage VR3. For example, in the second sense operation, if the voltage of the odd bit line BLo0 is lowered when the second read voltage VR2 is supplied to the odd memory cells, the threshold voltages of the odd memory cells are sensed as the second level PV1 which is higher than the first read voltage VR1, but lower than the second read voltage VR2.

Since the voltage of the odd bit line BLo0 is lowered in the second read operation, the voltage of the even bit line BLe1 is lowered owing to the capacitance coupling phenomenon. The page buffer PBb detects a shift in the voltage of the even bit line BLe1 and stores data values, corresponding to the threshold voltages of the odd memory cells, in the latch circuit 300L. Accordingly, the page buffer PBb can detect the threshold voltages of the odd memory cells coupled to the odd bit line BLo0 by detecting a shift in the voltage of the odd bit line BLo0 coupled to another page buffer PBa through the even bit line BLe1.

Meanwhile, the page buffer PBa detects a shift in the voltage of the odd bit line BLo0 through the read operation and stores data values, corresponding to the threshold voltages of the odd memory cells, in the latch circuit 300L of the page buffer PBa.

An operation of a page buffer PBc detecting the threshold voltages of odd memory cells coupled to yet another odd bit line BLo1 is described with reference to Referring to FIG. 3B.

First, a switching element (for example, 310N) of the bit line control circuit 310C of a page buffer PBc is turned off so that an even bit line BLe2 coupled to the even-numbered page buffers PBb and PBd becomes a floating state. The odd bit lines BLo1 of the odd-numbered page buffer PBb is precharged to the precharge voltage supplied from the latch circuit 300L via the switching elements 310N and 312N of the page buffer PBb. Here, a parasitic capacitor Cp3 is placed between the odd bit line BLo1 and the even bit line BLe2, and the even bit line BLe2 is in the floating state. Accordingly, when the voltage of the odd bit line BLo1 is raised by a capacitance coupling phenomenon, the voltage of the even bit line BLe2 rises. At this time, a specific voltage (for example, the ground voltage) generated from the virtual voltage source VIRPWR may be supplied to the remaining bit lines BLo0, BLe1, BLo2, and BLe3 through the switching elements 314N or 316N so that the remaining bit lines BLo0, BLe1, BLo2, and BLe3 function to shield the capacitance coupling phenomenon Next, a sense operation (or a read operation) for detecting the threshold voltages of the odd memory cells is performed using the read voltages VR1 to VR3. In the sense operation, when the threshold voltages of the odd memory cells are higher than the read voltage supplied to the odd memory cells, the voltage of the odd bit line BLo1 is lowered. The sense operation includes a first sense operation using the first read voltage VR1, a second sense operation using the second read voltage VR2, and a third sense operation using the third read voltage VR3. For example, in the third sense operation, if the voltage of the odd bit line BLo1 is lowered when the third read voltage VR3 is supplied to the odd memory cells, the threshold voltages of the odd memory cells are sensed as the third level PV2 which is higher than the second read voltage VR2, but lower than the third read voltage VR3.

Since the voltage of the odd bit line BLo1 is lowered in the second read operation, the voltage of the even bit line BLe2 is also lowered owing to the capacitance coupling phenomenon. The page buffer PBc detects a shift in the voltage of the even bit line BLe2 and stores data values, corresponding to the threshold voltages of the odd memory cells, in the latch circuit 300L. Accordingly, the page buffer PBc can detect the threshold voltages of the odd memory cells coupled to the odd bit line BLo1 by detecting a shift in the voltage of the odd bit line BLo1, coupled to the page buffer PBb, through the capacitance coupling phenomenon.

Meanwhile, the page buffer PBb also detects a shift in the voltage of the odd bit line BLo1 through the read operation and stores data values, corresponding to the threshold voltages of the odd memory cells, in the latch circuit 300L of the page buffer PBb.

The operations of the page buffers PBa to PBd are performed under the control of the controller 120.

Referring back to FIGS. 1 and 2, mask data is generated based on the detection values of threshold voltages of the odd memory cells which are stored in the page buffers of the page buffer group, at step S216. The mask data includes data, indicating a shift in the threshold voltages of the even memory cells due to the program interference phenomenon and corresponding to the detection values of threshold voltages of the odd memory cells which are detected through the odd bit lines BLo0 and BLo1 placed on both sides of the even bit line BLe1. The mask data may become the detection values stored in the page buffers of the page buffer group, and the controller 120 may control the page buffers so that the mask data is generated. Furthermore, the mask data may be generated by the controller 120 using the detection values. The mask data may be stored in an internal device (for example, a register) of the controller 120.

At step S218, after the levels of MSB read voltages (that is, the read voltages VR1, VR2, and VR3 of FIG. 4) for the MSB read operation of the even pages are set based on the mask data, the MSB read operation of the even pages may be performed by sequentially supplying the set MSB read voltages to the memory cells. In some embodiments, the MSB read operation of the even pages may be performed several times while changing each of the read voltages within a permitted limit, and the controller 120 may control the page buffer group 150 so that proper data can be stored in the page buffer group 150 according to the mask data from among the read data. The above methods may also be applied to another embodiment to be described later.

At step S208, the data latched in the page buffer group 150 is outputted.

FIG. 5 is a flowchart illustrating a method of operating the semiconductor memory device according to another exemplary embodiment of this disclosure. In the following method, a program operation is performed according to an incremental step pulse program (ISPP) method, and a read operation is performed when an increment of a program voltage when the program operation for an even word line is performed is lower than an increment of the program voltage when the program operation for an odd word line is performed.

Referring to FIGS. 1 and 5, the read operation for a selected page is performed by supplying a read voltage (for example, the ground voltage) to the word line of the selected page at step S502. At this time, data stored in memory cells coupled to the word line and data stored in the flag cells coupled thereto are stored in the page buffer group 150.

At step S504, the controller 120 checks the data of the flag cells in the data stored in the page buffer group 150 and determines whether data of 2 bits has been stored in the memory cells.

If, as a result of the determination, only data of 1 bit (that is, LSB data) not the data of 2 bits is stored in the memory cells, MSB data stored in the memory cells of the selected page is randomly set at step S506 in order to match the read operation with a read operation for memory cells which are included in another memory block or coupled to another word line and configured to store data of 2 bits (that is, LSB data and MBS data). For example, MSB data having the same value (for example, '1') may be set so that it is stored in all memory cells although the MSB data has not been stored in all the memory cells. Such setting is performed within the page buffer group 150 under the control of the controller 120.

The MSB data, randomly set and stored in the page buffer group 150, is outputted at step S508.

Meanwhile, if, as a result of the determination at step S504, the data of 2 bits (that is, LSB data and MSB data) is determined to be stored in the memory cells, it is checked whether the selected page includes even pages at step S510.

If, as a result of the check at step S510, the selected page includes the odd pages Cb1 and Cd1 not the even pages, it is checked whether the word line of the selected page is the even word line WL0 at step S512. If, as a result of the check at step S512, the word line is the odd word line WL1 not the even word line, the MSB read operation for the odd pages Cb1 and Cd1 of the odd word line WL1 is performed as in the step S210, at step S514.

As the result of the MSB read operation, the MSB data stored in the odd pages Cb1 and Cd1 of the odd word line WL1 is stored in the page buffer group 150. The least program interference phenomenon due to a program operation for neighboring memory cells is generated in the memory cells included in the odd pages Cb1 and Cd1 of the odd word line WL1. Accordingly, the MSB read operation of the odd pages Cb1 and Cd1 of the odd word line WL1 is normally performed by not taking the program interference phenomenon into consideration.

The following steps S516, S518, and S520 are performed in order to compensate for a shift in the threshold voltages of the memory cells, coupled to the even word line WL0, due to the program interference phenomenon occurring in the program operation for the odd word line WL1. In other words, the level of threshold voltages of memory cells coupled to a word line adjacent to a specific word line are detected, and mask data is generated based on the detected level. If the detected level is high, the threshold voltages of the memory cells coupled to the specific word line are determined to be shifted owing to a program interference phenomenon. Data stored in the memory cells is outputted by controlling a read operation condition based on the mask data.

If, as a result of the check at step S512, the selected page is the even word line WL0, the threshold voltages of the memory cells coupled to the odd word line WL1 are detected at step S516. In this case, the threshold voltages of the memory cells coupled to the odd word line WL1 can be easily detected because neighboring memory cells, from among the memory cells coupled to the even word line WL0 and the memory cells coupled to the odd word line WL1, share a page buffer.

At step S518, the controller 120 generates mask data based on the detection values of threshold voltages of the memory cells coupled to the odd word line WL1, stored in the respective page buffers of the page buffer group 150, and stores the masked data therein.

At step S520, the MSB read operation for the odd pages Cb0 and Cd0 of the even word line WL0 is performed several times within a permitted limit of a read voltage. The controller 120 controls the page buffer group 150 so that proper data of the read data can be selectively stored in the page buffer group 150 according to the mask data.

At step S508, the data stored in the page buffer group 150 is outputted.

If, as a result of the check at step S510, the selected page includes the even pages, it is checked whether the word line of the even pages is an even word line at step S522.

If, as a result of the check at step S522, the word line of the even pages is the odd word line WL1 including the even pages Ca1 and Cc1, steps S524, S526, and S528 are performed in order to compensate for a shift in the threshold voltage of the memory cells, included in the even pages Ca1 and Cc1, due to the program interference phenomenon in the program operation for the odd pages Cb1 and Cd1 of the odd word line WL1. The steps S524, S526, and S528 are performed in accordance with the same method as the steps S214, S216, and S218 described above with reference to FIG. 2, and thus a description thereof is omitted.

At step S508, the data stored in the page buffer group 150 is outputted.

If, as a result of the check at step S522, the selected page is the even word line WL0 including the even pages Ca0 and Cc0, steps S530 to S538 are performed in order to compensate for a shift in the threshold voltages of the memory cells, included in the even pages Ca0 and Cc0, due to the program interference phenomenon occurring in the program operation for the odd word line WL1 and the program interference phenomenon occurring in the program operation for the odd pages Cb0 and Cd0 of the even word line WL0.

The steps S530 and S532 are performed in accordance with the same method as the steps S516 and S520, and the steps S534, S536, and S538 are performed in accordance with the same method as the steps S524, S526, and S528. Accordingly, a description of the steps S530, S532, S524, S526, and S528 is omitted.

Next, at step S508, the data stored in the page buffer group 150 is outputted.

As described above, a read operation condition for even memory cells can be controlled with consideration taken of both program interference phenomena occurring in program operations for the even memory cells and odd memory cells adjacent to both sides of each of the even memory cells. Accordingly, reliability of outputted data can be improved.

In the exemplary embodiments of this disclosure, when a read operation for even pages is performed, a shift in the threshold voltages of even memory cells due to a program interference phenomenon is predicted by detecting the threshold voltages of the even memory cells and the threshold voltages of odd memory cells adjacent to the even memory cells. A read operation condition for the even memory cells is controlled based on the prediction results. Accordingly, reliability of outputted data can be improved.

Furthermore, all the threshold voltages of not only odd memory cells sharing a page buffer along with even memory cells, but also odd memory cells neighboring the even memory cells, but not sharing the page buffer are detected. A read operation condition for the even memory cells is controlled based on the detection results. Accordingly, reliability of a read operation can be further improved.

What is claimed is:

1. A semiconductor memory device, comprising:
a memory cell array configured to comprise even strings coupled to even bit lines and odd strings coupled to odd bit lines;
a voltage supply circuit configured to supply voltages for a program operation and a read operation of even memory cells included in the even strings and odd memory cells included in the odd strings;
page buffers each coupled to a pair of the even bit line and the odd bit line; and
a controller configured to control the page buffers so that each of the page buffers detects levels of threshold voltages of the odd memory cells placed on both sides of each of the even memory cells by detecting voltages of the odd bit lines placed on both sides of each of the even bit lines and to control the voltage supply circuit in order to control a read operation condition for the even memory cells each placed between the odd memory cells according to results of the detection.

2. The semiconductor memory device of claim 1, wherein, before the read operation of the even memory cells is performed, the controller sets even bit lines, coupled to even-numbered page buffers of the page buffers, in a floating state and controls the page buffers so that each of the even-numbered page buffers detects the level of threshold voltages of the odd memory cells by detecting a shift in voltage of the even bit line due to a capacitance coupling phenomenon when voltage of an odd bit line coupled to each of odd-numbered page buffers of the page buffers is changed by the read operation of the odd memory cells.

3. The semiconductor memory device of claim 2, wherein the controller controls the page buffers so that a ground voltage is supplied to the odd bit line coupled to the even-numbered page buffer and to the even bit line coupled to the odd-numbered page buffer.

4. The semiconductor memory device of claim 1, wherein, before the read operation of the even memory cells is performed, the controller sets even bit lines, coupled to odd-numbered page buffers of the page buffers, in a floating state and controls the page buffers so that each of the odd-numbered page buffers detects the level of threshold voltages of the odd memory cells by detecting a shift in voltage of the even bit line due to a capacitance coupling phenomenon when voltage of an odd bit line coupled to even-numbered page buffers of the page buffers is changed by the read operation of the odd memory cells.

5. The semiconductor memory device of claim 4, wherein the controller controls the page buffers so that a ground voltage is supplied to the odd bit line coupled to the odd-numbered page buffer and to the even bit line coupled to the even-numbered page buffer.

6. The semiconductor memory device of claim 1, wherein the controller generates mask data based on the detected level of threshold voltages of the odd memory cells placed on both sides of each of the even memory cells, performs the read operation while changing a read voltage within a permitted limit, and outputs data selected according to the mask data, from among the data of the even memory cells outputted through the read operation.

7. A method of operating a semiconductor memory device, comprising:
allowing each of page buffers, coupled to a pair of bit lines including an even bit line and an odd bit line, to detect a level of threshold voltages of odd memory cells placed on both sides of each of even memory cells by detecting voltages of odd bit lines placed on both sides of the even bit line;
generating mask data based on the detected level; and
performing a read operation for supplying read voltages, set based on the mask data, to the even memory cells in order to output data stored in the even memory cells.

8. The method of claim 7, wherein detecting the level of threshold voltages of the odd memory cells comprises: setting even bit lines, coupled to even-numbered page buffers of the page buffers, in a floating state; allowing each of the even-numbered page buffers to detect a shift in voltage of the even bit line due to a capacitance coupling phenomenon when voltage of an odd bit line coupled to each of odd-numbered page buffers of the page buffers is changed by a read operation of the odd memory cells; setting even bit lines, coupled to the odd-numbered page buffers of the page buffers, in a floating state; and allowing each of the odd-numbered page buffers to detect a shift in voltage of the even bit line due to a capacitance coupling phenomenon when the voltage of the odd bit line coupled to the odd-numbered page buffer is changed by the read operation of the odd memory cells.

9. The method of claim 8, wherein, while the even bit lines coupled to the even-numbered page buffers are set in the floating state and the shift in the voltage of the even bit line is detected by the even-numbered page buffer, a ground voltage is supplied to the odd bit line coupled to the even-numbered page buffer and to the even bit line coupled to the odd-numbered page buffer.

10. The method of claim 8, wherein, while the even bit lines coupled to the odd-numbered page buffers are set in the floating state and the shift in the voltage of the even bit line is detected by the odd-numbered page buffer, a ground voltage is supplied to the odd bit line coupled to the odd-numbered page buffer and to the even bit line coupled to the even-numbered page buffer.

11. The method of claim 7, wherein performing the read operation comprises: performing the read operation while changing the read voltages having different levels within a permitted limit, and outputting data selected according to the mask data, from the data of the even memory cells outputted through the read operation.

12. A method of operating a semiconductor memory device, comprising:
generating first mask data for determining whether a program interference phenomenon has occurred in memory cells coupled to a selected word line by sensing a level of threshold voltages of memory cells coupled to a word line adjacent to the selected word line;
allowing each of page buffers, each coupled to a pair of bit lines including an even bit line and an odd bit line, to detect a level of threshold voltages of odd memory cells placed on both sides of each of even memory cells coupled to the selected word line by detecting voltages of the even bit line and the odd bit lines placed on both sides of the even bit line;

generating second mask data corresponding to the detected level of threshold voltages of the odd memory cells; and performing a read operation for supplying, to the even memory cells, read voltages set based on the first and the second mask data in order to output data stored in the even memory cells.

13. The method of claim 12, wherein detecting the level of threshold voltages of the odd memory cells comprises: setting even bit lines, coupled to even-numbered page buffers of the page buffers, in a floating state; allowing each of the even-numbered page buffers to detect a shift in voltage of the even bit line due to a capacitance coupling phenomenon when voltage of an odd bit line coupled to each of odd-numbered page buffers of the page buffers is changed by a read operation of the odd memory cells; setting even bit lines, coupled to the odd-numbered page buffers of the page buffers, in a floating state; and allowing each of the odd-numbered page buffers to detect a shift in voltage of the even bit line due to a capacitance coupling phenomenon when the voltage of the odd bit line coupled to the odd-numbered page buffer is changed by the read operation of the odd memory cells.

14. The method of claim 13, wherein, while the even bit lines coupled to the even-numbered page buffers are set in the floating state and the shift in the voltage of the even bit line is detected by the even-numbered page buffer, a ground voltage is supplied to the odd bit line coupled to the even-numbered page buffer and to the even bit line coupled to the odd-numbered page buffer.

15. The method of claim 13, wherein, while the even bit lines coupled to the odd-numbered page buffers are set in the floating state and the shift in the voltage of the even bit line is detected by the odd-numbered page buffer, a ground voltage is supplied to the odd bit line coupled to the odd-numbered page buffer and to the even bit line coupled to the even-numbered page buffer.

16. The method of claim 12, wherein performing the read operation comprises: performing the read operation while changing the read voltages having different levels within a permitted limit, and outputting data selected according to the mask data, from the data of the even memory cells outputted through the read operation.

17. A semiconductor memory device, comprising:
a first page buffer coupled to a first even bit line and a first odd bit line;
a second page buffer coupled to a second even bit line and a second odd bit line; and
a controller configured to control the first and the second page buffers so that the second page buffer sets the second even bit line in a floating state such that voltage of the second even bit line is changed according to a shift in voltage of the first odd bit line, when a read operation for memory cells coupled to the first odd bit line is performed, and the second page buffer stores data corresponding to a level of threshold voltages of the memory cells by detecting a shift in the voltage of the second even bit line.

18. The semiconductor memory device of claim 17, wherein the controller controls the first and the second page buffers so that a ground voltage or a power supply voltage is supplied to the first even bit line and the second odd bit line during the read operation.

19. The semiconductor memory device of claim 17, wherein the controller controls the first page buffer so that the data corresponding to the level of threshold voltages of the memory cells is stored in the first page buffer.

20. A method of operating a semiconductor memory device, comprising:
precharging a first odd bit line, coupled to a first page buffer and adjacent to a second even bit line, in a state in which the second even bit line coupled to a second page buffer is floated;
performing a read operation in order to detect a level of threshold voltages of memory cells coupled to the first odd bit line; and
detecting a shift in voltage of the second even bit line due to a capacitance coupling phenomenon according to a shift in voltage of the first odd bit line resulting from the read operation and storing data, corresponding to the level of threshold voltages of the memory cells, in the second page buffer.

21. The method of claim 20, wherein during the read operation, a ground voltage or a power supply voltage is supplied to the first even bit line coupled to the first page buffer and the second odd bit line coupled to the second page buffer.

22. The method of claim 20, wherein when the data is stored in the second page buffer, the data is stored in the first page buffer.

* * * * *